US012685215B2

(12) United States Patent
Huang et al.

(10) Patent No.: US 12,685,215 B2
(45) Date of Patent: Jul. 14, 2026

(54) STACKED LAYERS WITH FILLING STRUCTURES

(71) Applicant: YANGTZE MEMORY TECHNOLOGIES CO., LTD., Wuhan (CN)

(72) Inventors: Qingyi Huang, Wuhan (CN); Zhen Pan, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 393 days.

(21) Appl. No.: 18/348,170

(22) Filed: Jul. 6, 2023

(65) Prior Publication Data

US 2024/0355689 A1      Oct. 24, 2024

(30) Foreign Application Priority Data

Apr. 24, 2023    (CN) ......................... 202310451366.X

(51) Int. Cl.
| | |
|---|---|
| *H10W 76/42* | (2026.01) |
| *H10B 80/00* | (2026.01) |
| *H10W 80/00* | (2026.01) |
| *H10W 90/00* | (2026.01) |

(52) U.S. Cl.
CPC ............ *H10W 76/42* (2026.01); *H10B 80/00* (2023.02); *H10W 80/312* (2026.01); *H10W 80/327* (2026.01); *H10W 90/792* (2026.01)

(58) Field of Classification Search
CPC ........... H01L 24/80; H01L 2224/08145; H01L 23/18; H01L 24/08; H01L 2224/80895; H01L 2224/80896; H10B 80/00; H10B 43/50; H10B 43/40
See application file for complete search history.

(56) References Cited

U.S. PATENT DOCUMENTS

| | | | | |
|---|---|---|---|---|
| 9,748,206 | B1 * | 8/2017 | Huang ................. | H01L 23/564 |
| 11,855,021 | B2 * | 12/2023 | Lin ....................... | H01L 23/481 |
| 2020/0043861 | A1 * | 2/2020 | Chen ...................... | H01L 24/20 |
| 2021/0066192 | A1 * | 3/2021 | Chen .................. | H01L 23/5227 |
| 2023/0395547 | A1 * | 12/2023 | Kweon ................. | H10B 43/50 |
| 2024/0120319 | A1 * | 4/2024 | Chung .................. | H01L 24/80 |
| 2024/0136311 | A1 * | 4/2024 | Jeon ........................ | H01L 24/06 |
| 2024/0170458 | A1 * | 5/2024 | Ji ............................ | H01L 24/16 |
| 2024/0194648 | A1 * | 6/2024 | Jung ..................... | H01L 24/94 |
| 2024/0413052 | A1 * | 12/2024 | Huang ................... | H01L 23/42 |

* cited by examiner

*Primary Examiner* — Mamadou L Diallo
(74) *Attorney, Agent, or Firm* — Conley Rose, P.C.

(57) ABSTRACT

Implementations of the present disclosure include a semiconductor structure comprising a stack structure comprising a first stack layer and a second stack layer stacked together, wherein a first region and a second region surrounding the first region are disposed in the stack structure, and a first surface of the first region and a first surface of the second region are coplanar; and a filling structure located on a second surface of the second region, wherein the second surface and the first surface of the second region are respectively two surfaces of the second region disposed oppositely in a first direction that is parallel to a stack layer extending direction of the stack structure.

16 Claims, 13 Drawing Sheets

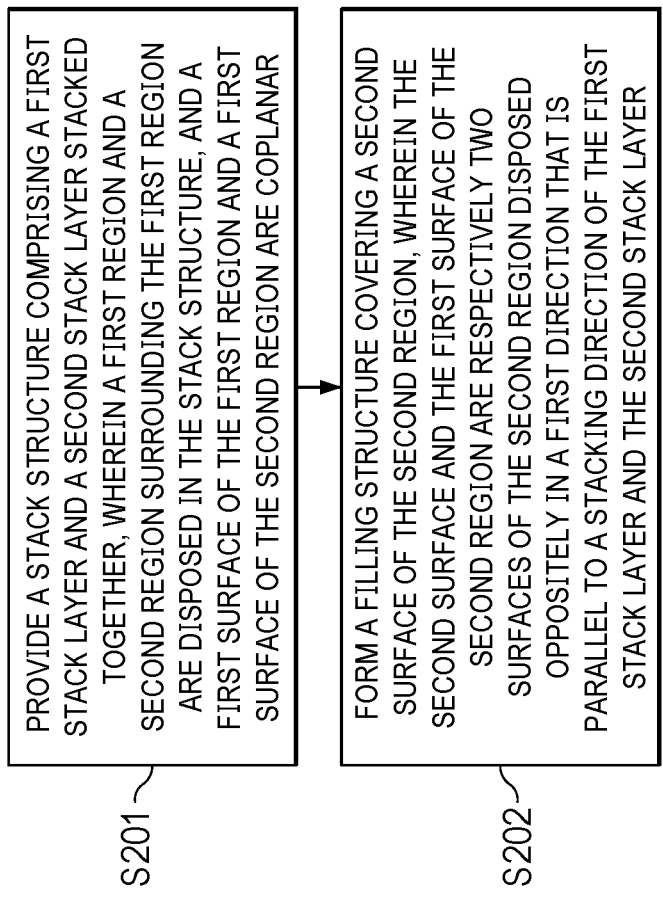

S201 — PROVIDE A STACK STRUCTURE COMPRISING A FIRST STACK LAYER AND A SECOND STACK LAYER STACKED TOGETHER, WHEREIN A FIRST REGION AND A SECOND REGION SURROUNDING THE FIRST REGION ARE DISPOSED IN THE STACK STRUCTURE, AND A FIRST SURFACE OF THE FIRST REGION AND A FIRST SURFACE OF THE SECOND REGION ARE COPLANAR

S202 — FORM A FILLING STRUCTURE COVERING A SECOND SURFACE OF THE SECOND REGION, WHEREIN THE SECOND SURFACE AND THE FIRST SURFACE OF THE SECOND REGION ARE RESPECTIVELY TWO SURFACES OF THE SECOND REGION DISPOSED OPPOSITELY IN A FIRST DIRECTION THAT IS PARALLEL TO A STACKING DIRECTION OF THE FIRST STACK LAYER AND THE SECOND STACK LAYER

FIG. 3

STACKED LAYERS WITH FILLING STRUCTURES

CROSS-REFERENCE TO RELATED APPLICATIONS

The present application claims priority to Chinese Patent Application No. 202310451366X, which was filed Apr. 24, 2023, is titled "SEMICONDUCTOR STRUCTURE AND FABRICATION METHOD THEREOF, MEMORY DEVICE AND MEMORY SYSTEM," and is hereby incorporated herein by reference in its entirety.

TECHNICAL FIELD

The present disclosure relates to the technical field of semiconductors, and particularly to, but not limited to, a semiconductor structure and a fabrication method thereof, a memory device and a memory system.

BACKGROUND

A semiconductor structure, for example, a three-dimensional (3D) NAND memory, is applied more and more widely in electronic products due to its advantages such as low power consumption and high integration density, etc. With the continuous development of the three-dimensional NAND memory technology, the number of layers of a stack structure in the three-dimensional NAND memory becomes higher and higher, from 24 layers to 48, 96, 128 and 192 or even higher numbers of layers, such that the capacity of an individual memory array block in the memory is continuously increasing.

SUMMARY

In order to address the relevant technical problems, implementations of the present disclosure provide a semiconductor structure and a fabrication method thereof, a memory device and a memory system. Implementations of the present disclosure provide a semiconductor structure comprising:

a stack structure comprising a first stack layer and a second stack layer stacked together, wherein a first region and a second region surrounding the first region are disposed in the stack structure, and a first surface of the first region and a first surface of the second region are coplanar; and a filling structure located on a second surface of the second region, wherein the second surface and the first surface of the second region are respectively two surfaces of the second region disposed oppositely in a first direction that is parallel to a stack layer extending direction of the stack structure.

In some implementations, a height of the first region in the first direction is greater than a height of the second region in the first direction, and a height of the filling structure in the first direction is less than or equal to a height difference of the first region and the second region in the first direction.

In some implementations, the height of the first region in the first direction is a first distance L1, the height of the second region in the first direction is a second distance L2, and the height of the filling structure in the first direction is a third distance L3, wherein $\frac{1}{3}(L1-L2)<L3\leq(L1-L2)$.

In some implementations, the second region at least comprises one layer structure; and a constituent material of the filling structure and a constituent material of the layer structure are the same.

In some implementations, the constituent material of the filling structure includes silicon, silicon nitride, silicon oxide or a photoresist material.

In some implementations, the semiconductor structure further comprises a protection layer that is at least located between the second surface of the second region and the filling structure.

In some implementations, the first stack layer comprises a peripheral circuit, and the second stack layer comprises a memory cell array.

Implementations of the present disclosure further provide a memory device comprising: one or more of the semiconductor structures as described in the above implementations of the present disclosure.

Implementations of the present disclosure further provide a memory system comprising: the memory device as described in the above implementations of the present disclosure; and a memory controller connected with the memory device and usable to control the memory device.

Implementations of the present disclosure further provide a fabrication method of a semiconductor structure, which comprises:

providing a stack structure comprising a first stack layer and a second stack layer stacked together, wherein a first region and a second region surrounding the first region are disposed in the stack structure, and a first surface of the first region and a first surface of the second region are coplanar; and forming a filling structure covering a second surface of the second region, wherein the second surface and the first surface of the second region are respectively two surfaces of the second region disposed oppositely in a first direction that is parallel to a stacking direction of the first stack layer and the second stack layer.

In some implementations, a height of the first region in the first direction is greater than a height of the second region in the first direction, and a height of the filling structure in the first direction is less than or equal to a height difference of the first region and the second region in the first direction.

In some implementations, the height of the first region in the first direction is a first distance L1, the height of the second region in the first direction is a second distance L2, and the height of the filling structure in the first direction is a third distance L3, wherein $\frac{1}{3}(L1-L2)<L3\leq(L1-L2)$.

In some implementations, providing the stack structure comprises:

providing a first semiconductor layer and a second semiconductor layer stacked together, wherein the first semiconductor layer and the second semiconductor layer each comprises a core area and a marginal area surrounding the core area; projections of the core area of the first semiconductor layer and the core area of the second semiconductor layer along the first direction overlap, and projections of the marginal area of the first semiconductor layer and the marginal area of the second semiconductor layer along the first direction overlap;

removing the marginal area of the second semiconductor layer, with the remaining second semiconductor layer constituting the second stack layer; and removing part of the marginal area of the first semiconductor layer,

3 with the remaining first semiconductor layer constituting the first stack layer, the first stack layer and the second stack layer being stacked together to constitute the stack structure, wherein the second stack layer and the core area of the first semiconductor layer constitute the first region, and part of the marginal area of the remaining first semiconductor layer constitutes the second region.

In some implementations, providing the first semiconductor layer and the second semiconductor layer stacked together comprises:

providing a first substrate, forming a first functional layer covering the first substrate, and forming a first bonding layer covering the first functional layer to form the first semiconductor layer;

providing a second substrate, forming a second functional layer covering the second substrate, and forming a second bonding layer covering the second functional layer to form the second semiconductor layer; and bonding the first bonding layer to the second bonding layer to form the first semiconductor layer and the second semiconductor layer stacked together.

In some implementations, removing the marginal area of the second semiconductor layer with the remaining second semiconductor layer constituting the second stack layer, comprises:

removing the marginal area of the second semiconductor layer, and removing the remaining second substrate, with the remaining second functional layer and the remaining second bonding layer constituting the second stack layer.

In some implementations, the method further comprises:

forming an adhesion layer at least on a second surface of the first region and a side surface of the filling structure after forming the filling structure, wherein the second surface of the first region and the first surface of the first region are two surfaces of the first region disposed oppositely in the first direction;

removing part of the marginal area of the first semiconductor layer, with the remaining first semiconductor layer constituting the first stack layer, comprises:

removing part of the marginal area of the first semiconductor layer, and thinning the first substrate, with the remaining first semiconductor layer constituting the first stack layer;

and the method further comprises: removing the adhesion layer after the thinning operation.

In some implementations, the remaining part of the first semiconductor layer at least comprises one layer structure; the material of the filling structure and the material of the layer structure are different.

In some implementations, the method further comprises:

forming a protection layer at least on the second surface of the second region before forming the filling structure, and forming the filling structure covering the second surface of the second region comprises:

forming the protection layer covering the second surface of the second region; and forming the filling structure covering the protection layer.

Implementations of the present disclosure provide a semiconductor structure and a fabrication method thereof, a memory device, and a memory system, wherein the semiconductor structure comprises: a stack structure comprising a first stack layer and a second stack layer stacked together, wherein a first region and a second region surrounding the first region are disposed in the stack structure, and a first surface of the first region and a first surface of the second region are coplanar; and a filling structure located on a second surface of the second region, wherein the second surface and the first surface of the second region are respectively two surfaces of the second region disposed oppositely in a first direction that is parallel to a stack layer extending direction of the stack structure. In other words, in the implementations of the present disclosure, by forming the filling structure on the second surface of the second region, relative stress of the second region is increased, and the probability of dropping particle impurities of the second portion in a grinding process is reduced, thereby reducing the damage of particle impurities to the first region, and improving the reliability of the semiconductor structure.

BRIEF DESCRIPTION OF THE DRAWINGS

FIG. 3 is a schematic flow diagram of a fabrication method of a semiconductor structure provided by implementations of the present disclosure.

Illustration of reference numerals:

Figure 1:
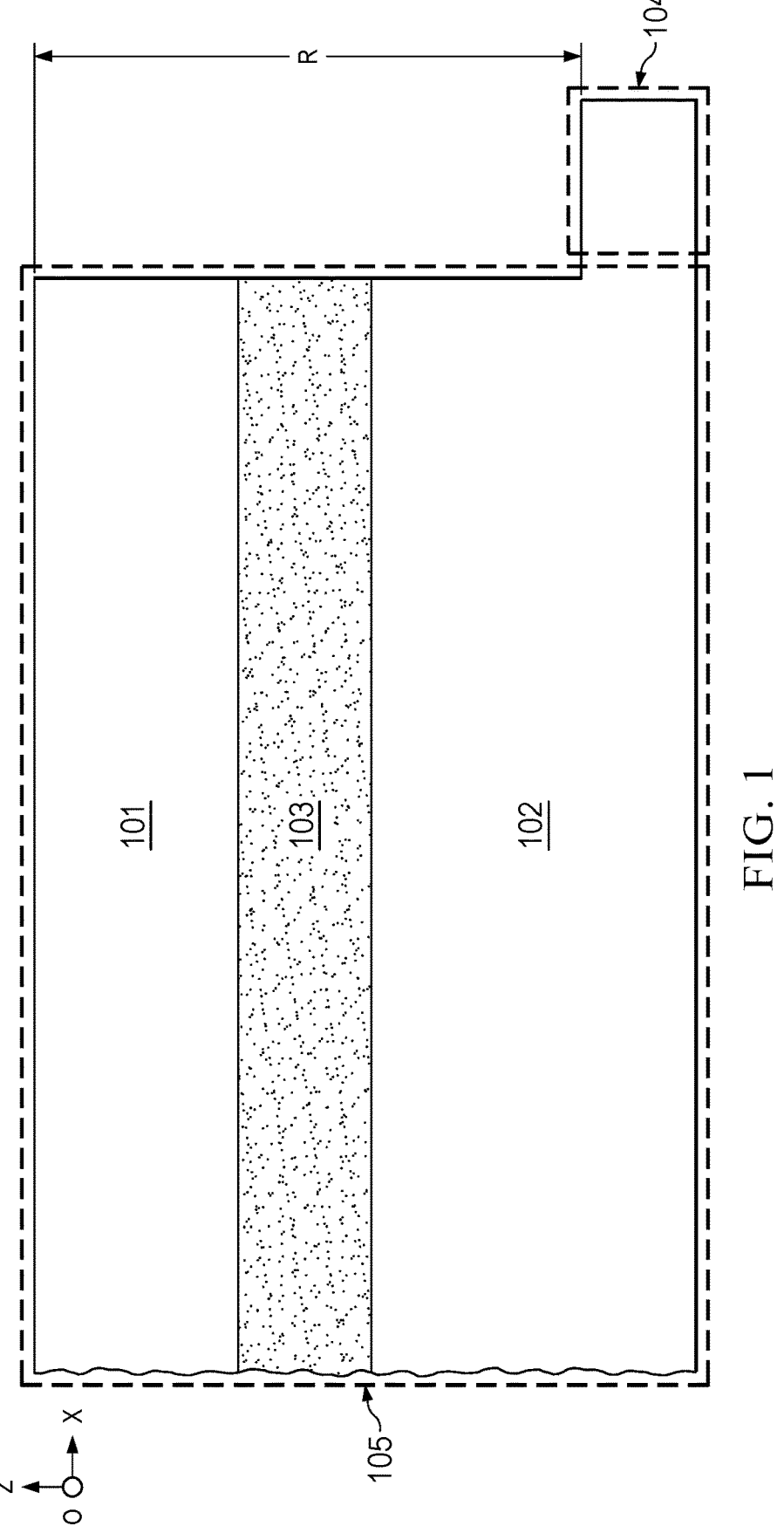
FIG. 1 is a schematic cross-sectional structure diagram of two wafers stacked together provided in implementations of the present disclosure.

101—First wafer; 102—Second wafer; 103—Bonding interface; 104—Remaining marginal area; 105—Core area; 106: BG tape; 107—Void; 108—Workbench; 20—Stack structure; 20a—First portion; 20b—Second portion; 30—First semiconductor layer; 301—First substrate; 302—First functional layer; 303—First bonding layer; 40—Second semiconductor layer; 401—Second substrate; 402—Second functional layer; 403—Second bonding layer; 3001—First stack layer; 30a—Core area; 30b—Marginal area; 4001—Second stack layer; 40a—Core area; 40b—Marginal area; 501—Third dielectric layer; 502—Interconnection structure; 503—Protection layer; 503a—First protection sub layer; 503b—Second protection sub-layer; 504—Filling structure; 505—Adhesion layer; 506—Void.

In the above drawings (not necessarily drawn to scale), like reference numerals may describe like components in different views. Like reference numerals having different letter suffixes may represent different examples of like components. The drawings generally illustrate various implementations as discussed herein, by way of example but not by way of limitation.

DETAILED DESCRIPTION

Exemplary implementations disclosed by the present disclosure will be described below in more detail with reference to the drawings. Although the exemplary implementations of the present disclosure are shown in the drawings, it is to be understood that the present disclosure may be achieved by various forms which should not be limited by the specific implementations as set forth herein. Rather, these implementations are provided in order to understand the present disclosure more thoroughly, and to fully convey the scope disclosed by the present disclosure to those skilled in the art.

In the description below, many specific details are presented to provide a more thorough understanding of the present disclosure. However, it is apparent to those skilled in the art that the present disclosure may be carried out without one or more of these details. In other examples, in order to avoid confusing with the present disclosure, some technical features well-known in the art are not described; that is, not all features of actual implementations are described herein, and well-known functions and structures are not described in detail.

In the drawings, for the purpose of clarity, sizes and relative sizes of layers, areas and elements may be exaggerated. Like reference numbers denote like elements throughout the specification.

Spatial relationship terms, such as "beneath," "below," "lower," "under," "over," "upper," and the like, may be used herein for ease of description to describe one element or feature's relationship to another element(s) or feature(s) as illustrated in the figures. It should be understood that, the spatial relationship terms are intended to encompass different orientations of the device in use or operation in addition to the orientation depicted in the figures. For example, if a device in the drawings is turned over, then an element or a feature described as "below other elements," or "under other elements," or "beneath other elements" will be orientated to be "above" the other elements or features. Thus, the exemplary terms, "below" and "beneath," may include both up and down orientations. The device may be orientated otherwise (rotated by 90 degrees or other orientations), and the spatial description terms used herein are interpreted accordingly.

The terms used herein are only intended to describe the specific implementations, and are not used as limitations of the present disclosure. As used herein, unless otherwise indicated expressly in the context, "a." "one" and "the" in a singular form are also intended to include a plural form. It should also be understood that the terms "consist of" and/or "comprise," when used in this specification, determine the presence of the feature, integer, step, operation, element and/or component, but do not preclude the presence or addition of one or more of other features, integers, steps, operations, elements, components, and/or groups. As used herein, the term "and/or" includes any and all combinations of the listed relevant items.

In order to understand the characteristics and the technical contents of the implementations of the present disclosure in more detail, the implementations of the implementations of the present disclosure are set forth in detail below in conjunction with the drawings, and the appended drawings are only used for reference and illustration, instead of being used to limit the implementations of the present disclosure.

In order to understand the present disclosure thoroughly, detailed operations and detailed structures will be provided in the following description so as to set forth the technical solution of the present disclosure. The detailed descriptions of the preferred implementations of the present disclosure are as follows. However, the present disclosure may also have other implementations in addition to these detailed descriptions.

The term "substrate" herein refers to a material onto which subsequent material layers are added. The substrate itself can be patterned. Materials added on the substrate can be patterned or can remain unpatterned.

The term "layer" herein refers to a material portion including a region with a certain thickness. A layer can extend over the entirety of an underlying structure or an overlying structure. or can have an extent less than the extent of an underlying structure or an overlying structure. Further, a layer can be a region of a homogeneous or inhomogeneous continuous structure that has a thickness less than the thickness of the continuous structure.

The semiconductor structure in the implementations of the present disclosure includes, but is not limited to, a 3D NAND memory. For case of understanding, the 3D NAND memory is taken as an example for illustration. It should be understood that, the 3D NAND memory may comprise a memory cell array and a peripheral circuit. The memory cell array may comprise a plurality of word line layers and a plurality of memory cell layers coupled to the plurality of word line layers.

With the development of the semiconductor technology, the storage capacity of the 3D NAND memory is continuously increasing, while the size of the memory presents a development trend of miniaturization. In order to reduce the size of the memory, the 3D NAND memory can be formed by means of bonding; for example, the peripheral circuit and the memory cell array are formed in different wafers respectively, and different wafers are stacked and bonded to reduce the size of the memory. However, after the bonding operation, a marginal area of a bonding interface of the two wafers stacked together is prone to generate impurities such as bubbles or debris, etc. In order to reduce the influence of the impurities such as the bubbles or the debris, etc. on the memory, part of the marginal area (including the bonding interface) of the two wafers stacked together is usually etched by means of trimming to remove the impurities such as the bubbles or the debris, etc. However, with the increasing number of the memory cell layers, the thickness of the two wafers stacked together gradually increases, and the etching depth of their marginal areas is increasingly deeper. For example, for a wafer with 128 memory cell layers, its etching depth is 28±7 micrometers ($\mu m$). Moreover, as the number of the memory cell layers in 3D NAND memory is increasingly higher, e.g., increasing from 128 layers to 192 layers, 256 layers or even more layers, its etching depth is gradually increased, e.g., increased from 28 $\mu m$ to 30 $\mu m$ and 40 $\mu m$. As such, a larger height difference is present between the remaining marginal area and a core area of the two wafers stacked together.

FIG. 1 shows a schematic cross-sectional structure diagram of two wafers stacked together provided in implementations of the present disclosure. As shown in FIG. 1, a first wafer 101 and a second wafer 102 are stacked and bonded to form two wafers stacked together, wherein a bonding interface 103 is formed at a bonding position of the first wafer 101 and the second wafer 102. The two wafers stacked together comprise a marginal area and a core area, and impurities such as bubbles or debris, etc. are formed in the bonding interface of the marginal area. Based on this, part of the marginal area of the two wafers stacked together is etched to remove the impurities in the bonding interface of the marginal area. However, after removing the impurities, a large height difference R is present between the remaining marginal area 104 and the core area 105.

Figure 2:
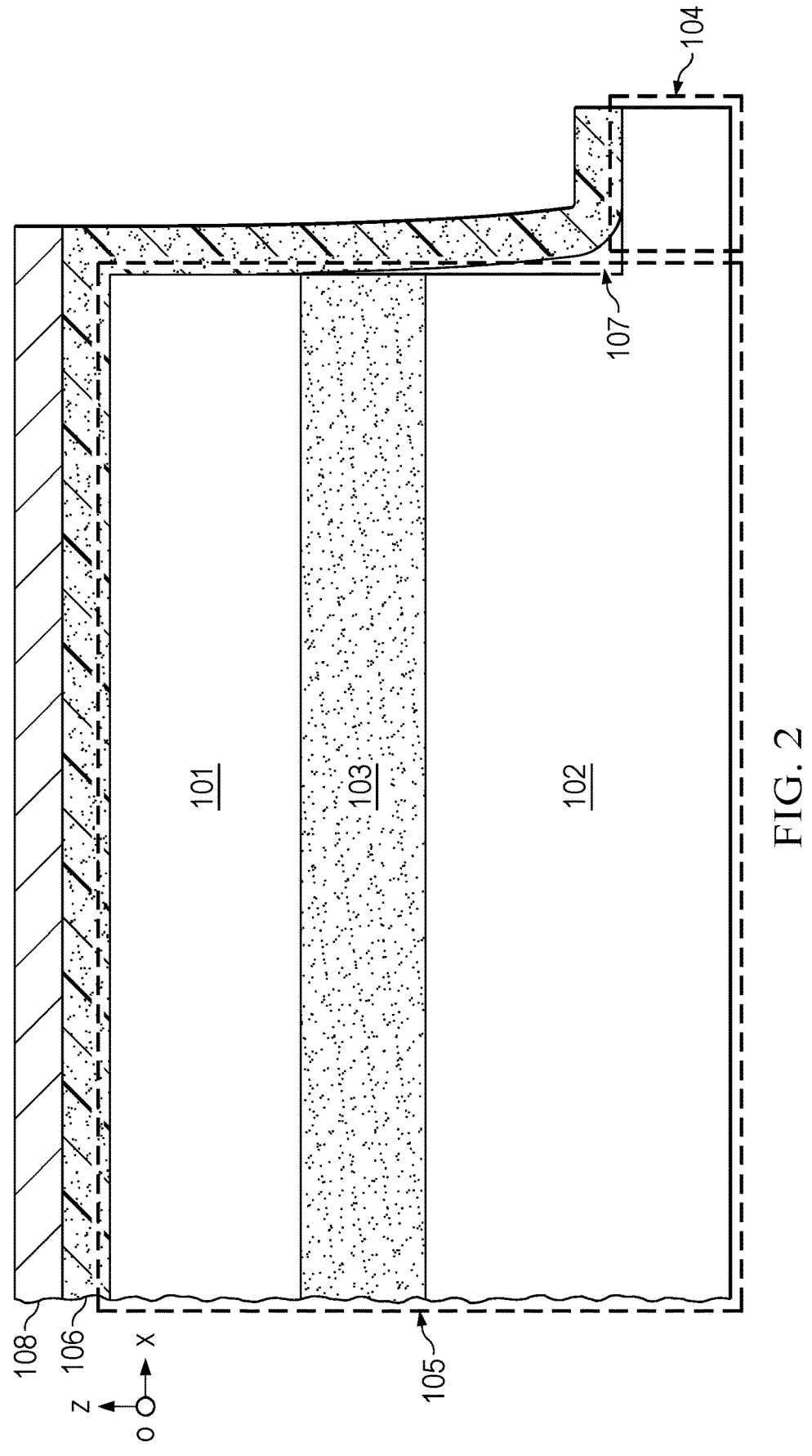
FIG. 2 is a schematic diagram of adhesion of a back grinding (BG) tape provided in implementations of the present disclosure.

In this case, packaging (PKG) of the two wafers stacked together may influence their reliability. In a packaging process, in order to reduce the overall thickness of the two wafers stacked together, they are usually thinned, for example, back grinding (BG) is performed on the two wafers, wherein before grinding the back of one of the two wafers, the back of the other wafer needs to be protected and fixed. The protection method may be to attach a BG tape on a side surface of each of the remaining marginal area 104 and the core area 105, and the method of fixing may include the use of a relevant device (such as a sucking disc) of a machine table to fix the BG tape. FIG. 2 shows a schematic cross-sectional diagram of attaching a BG tape provided in implementations of the present disclosure, wherein when grinding the back (a side surface of the second wafer 102 far away from the first wafer 101) of the second wafer 102, the BG tape 106 is attached to a side surface of each of the remaining marginal area 104 and the core area 105 with the height difference, and fixed by a workbench 108.

Due to the presence of the height difference, a stress difference also exists between the remaining marginal area 104 and the core area 105, such that sidewalls of the remaining marginal area 104 and the core area 105 are more prone to generate cracks and particle impurities when the back grinding is performed on the remaining marginal area 104 and the core area 105; moreover, the larger the height difference of the remaining marginal area 104 and the core area 105 is, the larger the stress difference existing therebetween is, and the remaining marginal area 104 is more prone to drop particle impurities, thereby causing greater damage to the memory cell layer or peripheral circuit due to the dropped particle impurities during the grinding process. Although the BG tape 106 has a certain capability of adhesion for the particle impurities, the larger the height difference of the remaining marginal area 104 and the core area 105 is, the larger a void 107 formed at a connection of the remaining marginal area 104 and the core area 105 is, and the looser the BG tape 106 is attached to the remaining marginal area 104; as such, the BG tape 106 cannot effectively adhere the particle impurities.

Based on this, in order to address one or more of the above problems, implementations of the present disclosure provide a semiconductor structure and a fabrication method thereof, a memory device and a memory system. FIG. 3 shows a schematic flow diagram of a fabrication method of a semiconductor structure provided by implementations of the present disclosure. The method comprises the following operations:

operation S201: providing a stack structure comprising a first stack layer and a second stack layer stacked together, wherein a first region and a second region surrounding the first region are disposed in the stack structure, and a first surface of the first region and a first surface of the second region are coplanar; and operation S202: forming a filling structure covering a second surface of the second region, wherein the second surface and the first surface of the second region are respectively two surfaces of the second region disposed oppositely in a first direction that is parallel to a stacking direction of the first stack layer and the second stack layer.

FIGS. 4a-4j are examples of cross-sectional views of a fabrication process of a semiconductor structure provided by implementations of the present disclosure. The operations as shown in FIG. 3 are not exclusive, and other operations can also be performed before, after, or between any of the illustrated operations. A formation process of the semiconductor structure of this embodiment is further described below in conjunction with FIGS. 3 and 4a-4j.

Operation S201 is performed to provide a stack structure. In some implementations, providing the stack structure comprises: providing a first semiconductor layer and a second semiconductor layer stacked together. Providing the first semiconductor layer and the second semiconductor layer stacked together comprises:

providing a first substrate, forming a first functional layer covering the first substrate. and forming a first bonding layer covering the first functional layer to form the first semiconductor layer;

providing a second substrate, forming a second functional layer covering the second substrate, and forming a second bonding layer covering the second functional layer to form the second semiconductor layer; and bonding the first bonding layer to the second bonding layer to form the first semiconductor layer and the second semiconductor layer stacked together.

Figure 4A:
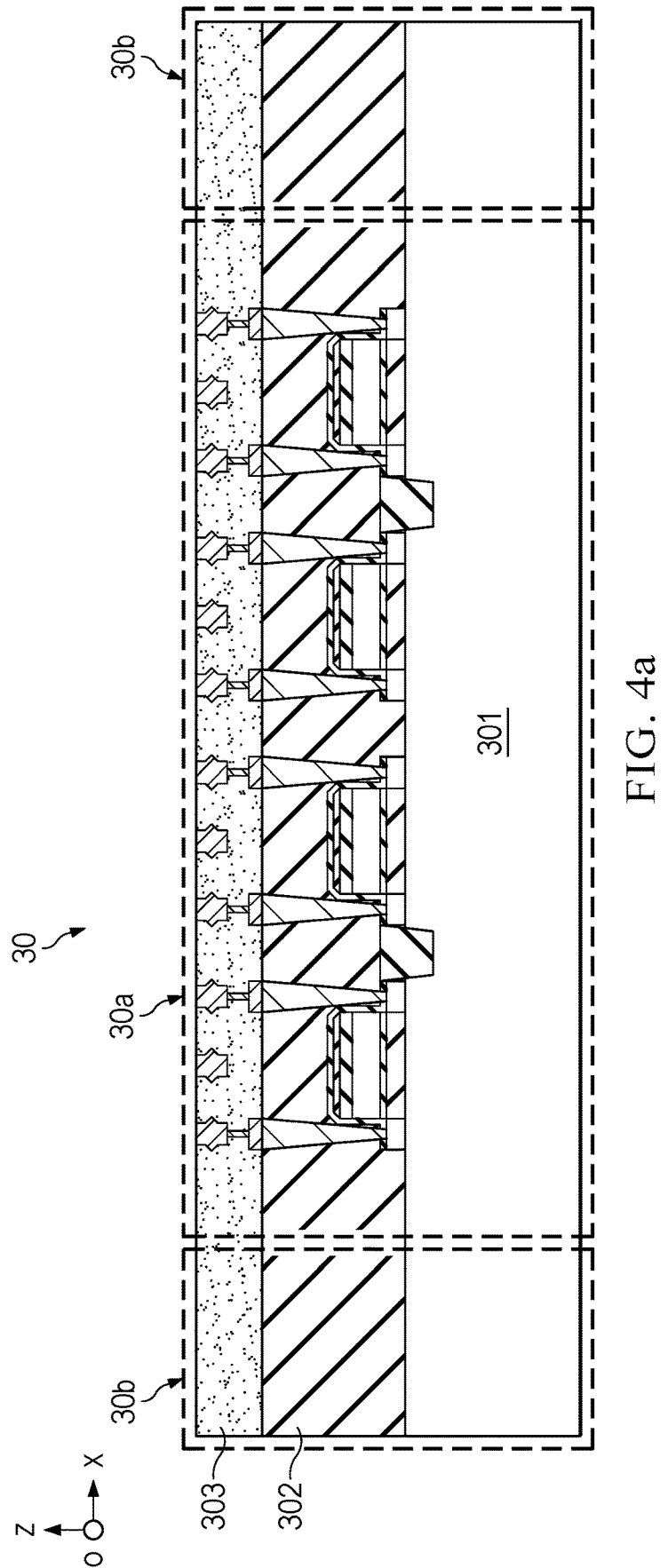
FIGS. 4a-4j are schematic cross-sectional diagrams of a fabrication process of a semiconductor structure provided by implementations of the present disclosure.

FIG. 4a shows a schematic cross-sectional structure diagram of the first semiconductor layer 30, wherein the first substrate 301 is provided, and the first substrate 301 may include an elemental semiconductor material substrate (e.g., a silicon (Si) substrate, a germanium (Ge) substrate, etc.), a composite semiconductor material substrate (e.g., a silicon germanium (SiGe) substrate, etc.), a silicon on insulator (SOI) substrate, a germanium on insulator (GeOI) substrate, etc. Preferably, the first substrate 301 is a silicon substrate. Next, the first functional layer 302 covering the first substrate 301 is formed, wherein the first functional layer 302 may comprise a peripheral circuit and an interconnection structure connected with the peripheral circuit, and the peripheral circuit may include any suitable digital, analog and/or hybrid signal circuit configured to facilitate a memory to achieve various operations such as a reading operation, writing operation, erasing operation and the like. For example, the peripheral circuit may comprise a control logic (e.g., a control circuit or a controller), a data buffer, a decoder, a driver and a reading-writing circuit, etc. When the control logic receives a reading-writing operation command and address data, under the action of the control logic, the decoder may apply respective voltages obtained from the driver to respective bit lines and word lines based on a decoded address, to achieve reading and writing of data.

Next, the first bonding layer 303 covering the first functional layer 302 is formed, and may comprise: a first dielectric layer, a plurality of first trenches penetrating through the first dielectric layer, and first conductive contacts located in the first trenches, wherein the first conductive contacts are connected with an interconnection structure in the first functional layer. The first semiconductor layer 30 may be divided into a core area 30a and a marginal area 30b surrounding the core area, wherein the peripheral circuit in the first functional layer 302 is located in the core area 30a of the first semiconductor layer.

Figure 4B:
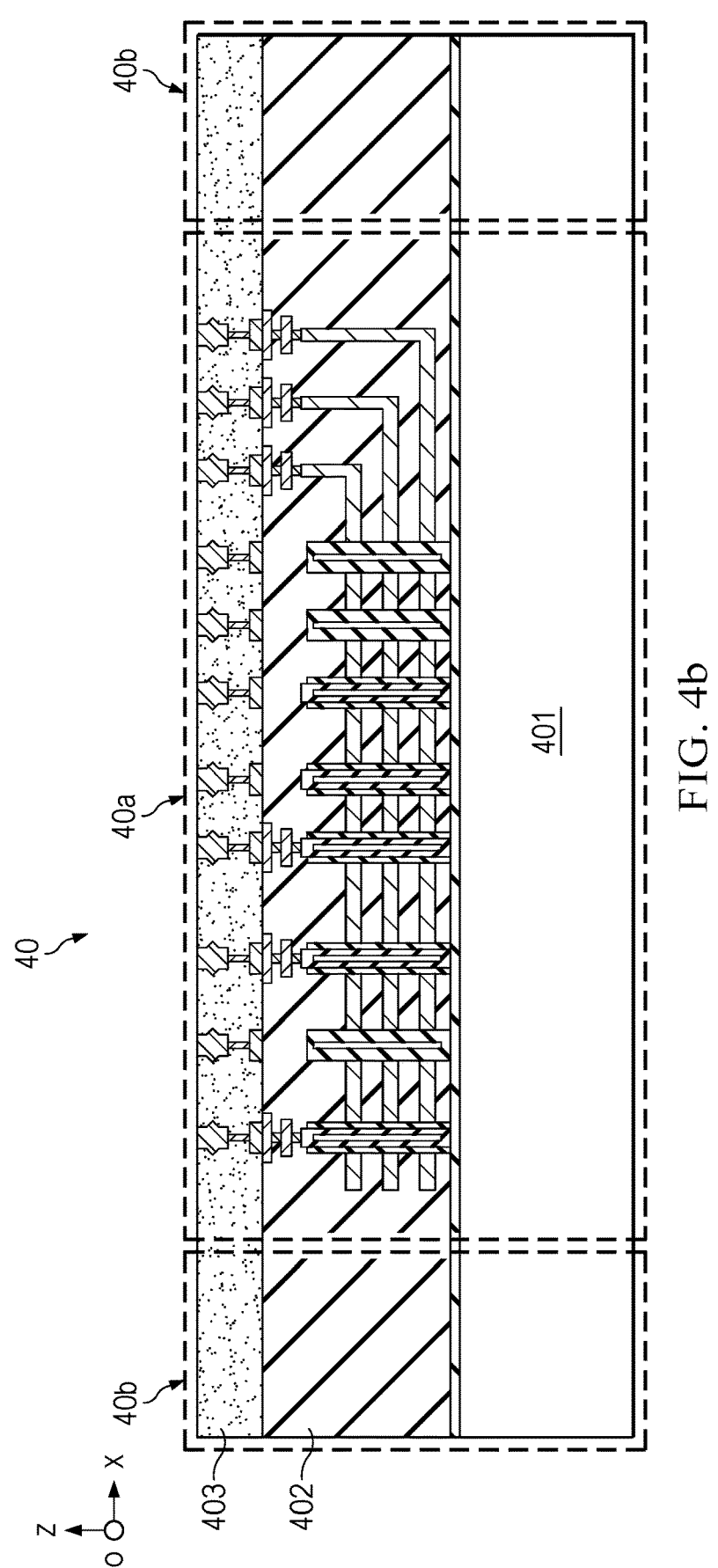

FIG. 4b shows a schematic cross-sectional structure diagram of the second semiconductor layer 40, wherein the second substrate 401 is provided and may be the same as the first substrate 301. The second functional layer 402 may comprise a memory cell array and an interconnection structure connected with the memory cell array, wherein the memory cell array may comprise a plurality of memory dies; each memory die may comprise a plurality of memory planes; each of the memory planes may comprise a plurality of memory blocks; each of the memory blocks may comprise a plurality of memory pages; each of the memory pages may comprise a plurality of memory cells; and each of the memory cells may be programmed and store one or more bits of data. In some particular implementations, each memory block may be coupled to a plurality of word lines; a plurality of memory cells coupled to each of the separately controlled word lines constitute a memory page, and all memory cells coupled to each memory page constitute a memory cell layer. A plurality of memory cells are provided in a form of an array of memory strings, and each memory string extends vertically above the second substrate. In some implementations, each memory string comprises a plurality of memory cells that are coupled in series and stacked vertically. Here, each memory cell may hold a continuous analog value, such as a voltage or charges, which depends on the number of electrons trapped within a region of the memory cell. Each memory cell may be either a floating gate memory cell that comprises a floating gate transistor, or a charge trapping memory cell that comprises a charge trapping transistor.

Next, the second bonding layer 403 covering the second functional layer 402 is formed, and may comprise: a second dielectric layer, a plurality of second trenches penetrating through the second dielectric layer, and second conductive contacts located in the second trenches, wherein the second conductive contacts are connected with an interconnection structure in the second functional layer. The second semiconductor layer 40 may also be divided into a core area 40a and a marginal area 40b surrounding the core area 40a, wherein the memory cell array in the second functional layer 402 is located in the core area 40a of the second semiconductor layer.

The positions of the first functional layer 302 and the second functional layer 402 may be interchanged. A structural topography of the first bonding layer 303 and a structural topography of the second bonding layer 403 may be the same or may be different. In particular, radial widths (here, the radial width may be interpreted as a width of a cross-section along a width direction of the first trenches) of the first conductive contacts and radial widths of the second conductive contacts may be equal or different. In a practical application, cross-sections of the first trenches and the second trenches may be round, elliptical or strip-shaped, etc.; the materials of the first dielectric layer and the second dielectric layer include, but are not limited to, silicon oxide, silicon nitride, silicon oxynitride, a low-k dielectric or any combination thereof; and the materials of the first conductive contacts and the second conductive contacts may include a conductive material, including, but not limited to, tungsten (W), cobalt (Co), copper (Cu), aluminum (Al), silicide or any combination thereof. Here, both metal bonding (conductive contacts) and dielectric material bonding exist on a bonding interface between the first bonding layer 303 and the second bonding layer 403.

In the implementations of the present disclosure, the method of forming the first functional layer 302, the second functional layer 402, the first bonding layer 303 and the second bonding layer 403 includes, but is not limited to, a deposition process and an etching process, wherein the deposition process includes, but is not limited to, chemical vapor deposition (CVD), physical vapor deposition (PVD), sputtering, or atomic layer deposition (ALD). In some implementations, the deposition process further includes plasma-enhanced CVD (PECVD), metal-organic chemical vapor deposition (MOCVD), etc. The etching process includes, but is not limited to, dry etching, wet etching, etc.

Figure 4C:
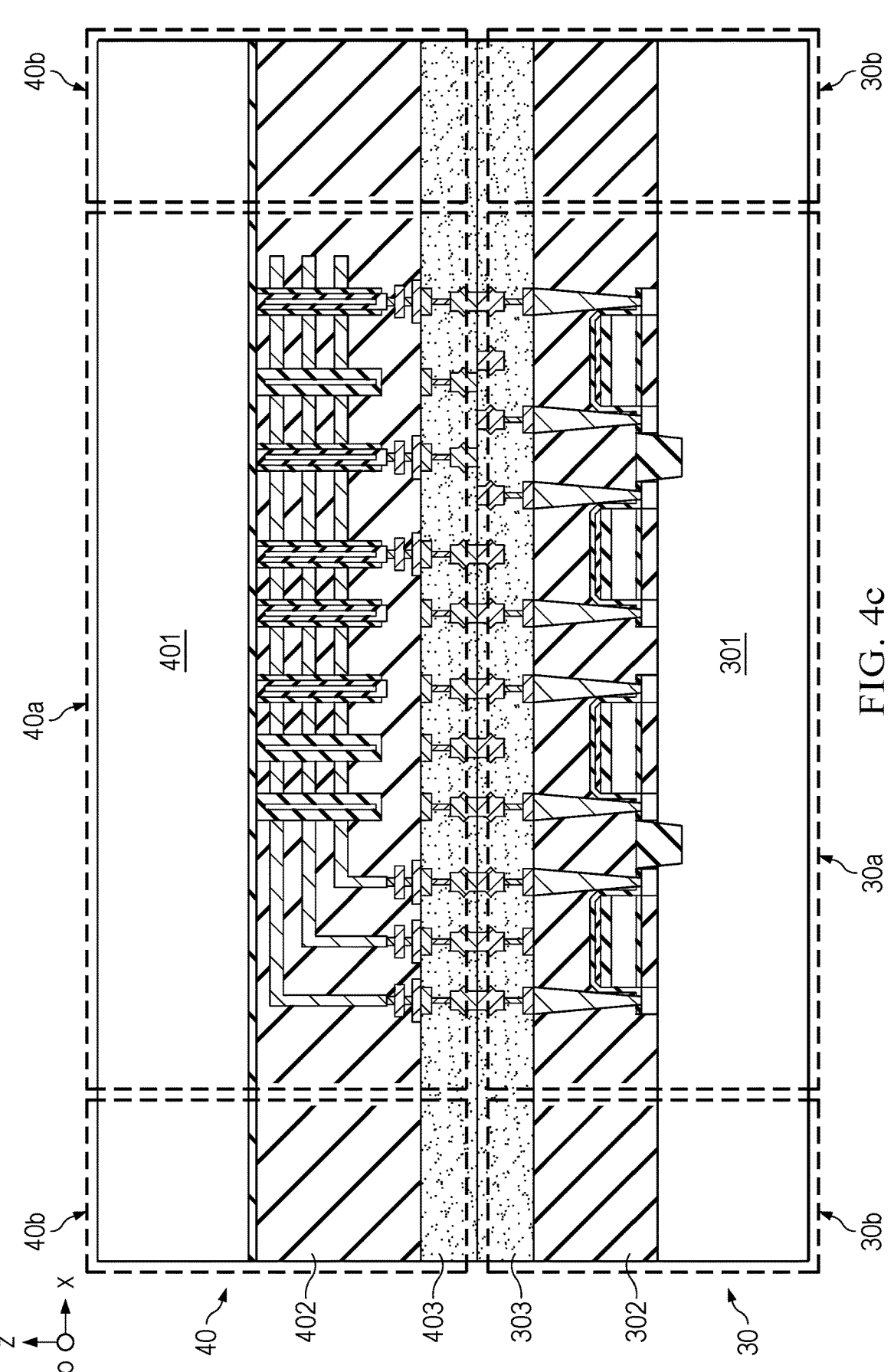

Next, referring to FIG. 4c, the first bonding layer 303 of the first semiconductor layer is bonded to the second bonding layer 403 of the second semiconductor layer to form the first semiconductor layer 30 and the second semiconductor layer 40 stacked together along the first direction. In some implementations of the present disclosure, the first direction is perpendicular to the second direction. The first direction is a Z axis direction, and the second direction may be an X axis direction or a Y axis direction. For ease of clear and concise description, the first direction is the Z axis direction, and the second direction is the X axis direction as an example in each drawing. In some implementations, referring to FIG. 4c, projections of the core area 30a of the first semiconductor layer and the core area 40a of the second semiconductor layer along the first direction overlap, and projections of the marginal area 30b of the first semiconductor layer and the marginal area 40b of the second semiconductor layer along the first direction overlap. In other words, the projection of the core area 30a of the first semiconductor layer on an XOY plane and the projection of the core area 40a of the second semiconductor layer on the XOY plane overlap, and the projection of the marginal area 30b of the first semiconductor layer on the XOY plane and the projection of the marginal area 40b of the second semiconductor layer on the XOY plane overlap.

After bonding the first semiconductor layer 30 and the second semiconductor layer 40. the first conductive contacts are conductively connected with the second conductive contacts by means of contacting, such that the conductive connection of the peripheral circuit and the memory cell array can be achieved. The first bonding layer and the second bonding layer are conjoined together to form a bonding interface, wherein impurities such as bubbles or debris, etc. formed in a bonding process are present in the bonding interface.

Next, the marginal area of the second semiconductor layer is removed, with the remaining second semiconductor layer constituting the second stack layer; and part of the marginal area of the first semiconductor layer is removed, with the remaining first semiconductor layer constituting the first stack layer; and the first stack layer and the second stack layer are stacked together to constitute the stack structure. Removing the marginal area of the second semiconductor layer and part of the marginal area of the first semiconductor layer is to remove the bonding interface located in the marginal areas, such that the impurities in the bonding interface located in the marginal areas may be removed.

Figure 4D:
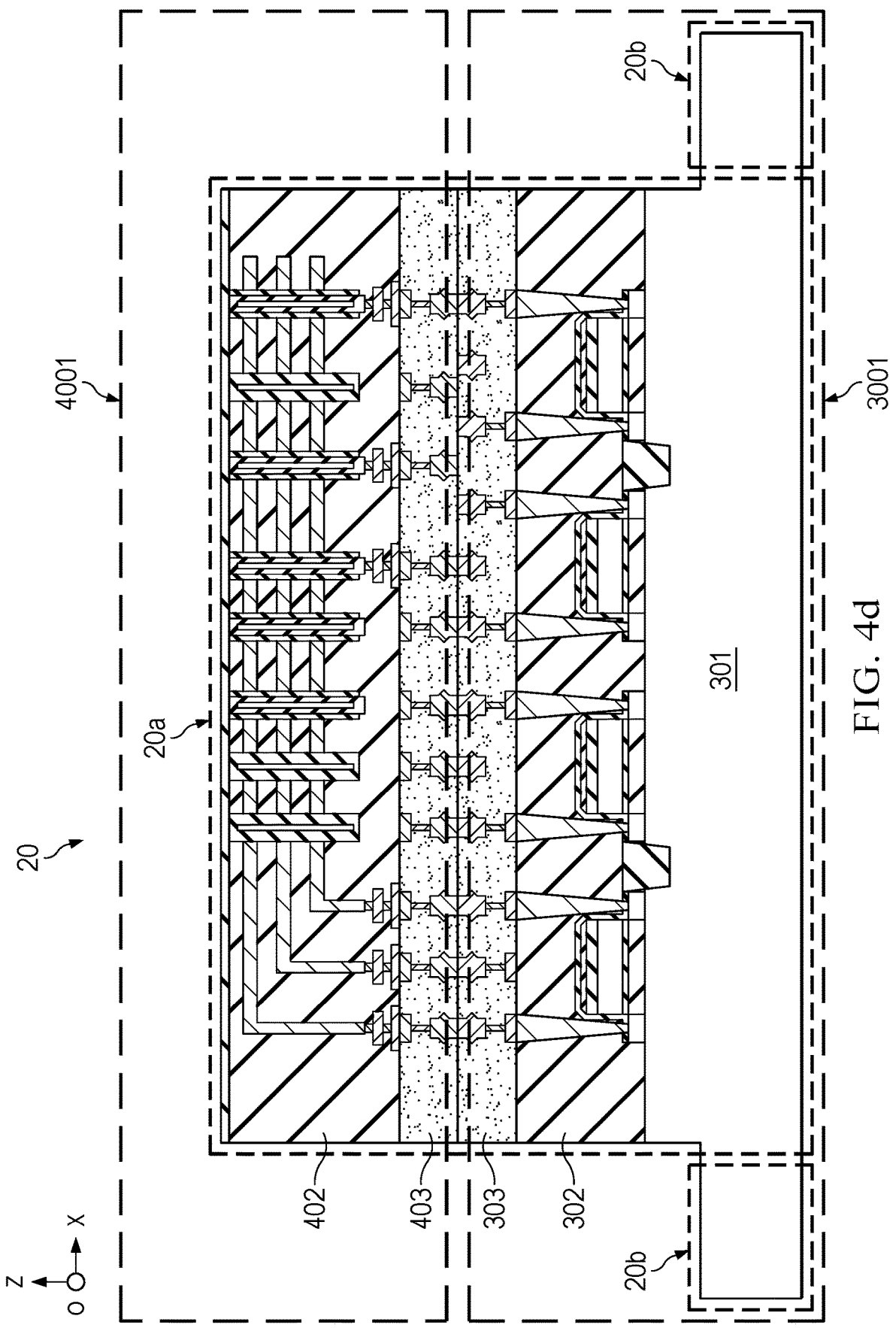

In some implementations, referring to FIG. 4d, removing the marginal area of the second semiconductor layer with the remaining second semiconductor layer constituting the second stack layer, comprises: removing the marginal area of the second semiconductor layer, and removing the remaining second substrate, with the remaining second functional layer and the remaining second bonding layer constituting the second stack layer 4001. A process of removing the marginal area includes, but is not limited to, dry etching, and a process of removing the second substrate includes, but is not limited to, chemical mechanical polishing (CMP).

At the same time as removing the marginal area of the second semiconductor layer, part of the marginal area of the first semiconductor layer is removed, and the part of the marginal area of the first semiconductor layer at least comprises the first bonding layer located in the marginal area. Based on this, the remaining first semiconductor layer may comprise the first functional layer and the first substrate, or the remaining first semiconductor layer may comprise part of the first functional layer and the first substrate, or the remaining first semiconductor layer may comprise part of the first functional layer and part of the first substrate. In this case, the remaining first semiconductor layer forms the first stack layer 3001, and the first stack layer 3001 and the second stack layer 4001 constitute the stack structure 20.

In the implementations of the present disclosure, referring to FIG. 4d, the stack structure 20 may be divided into a first portion 20a and a second portion 20b surrounding the first portion 20a, wherein the core area of the first semiconductor layer and the core area of the second semiconductor layer after removing the second substrate constitute the first portion 20a, and the marginal area of the remaining first semiconductor layer constitutes the second portion 20b. Here, the second portion 20b surrounds the first portion 20a, and a first surface of the first portion 20a and a first surface of the second portion 20b are coplanar. In other words, the first surface of the first portion 20a and the first surface of the second portion 20b are essentially the same surface of the first substrate 301. It should be understood that, the height of the first portion in the first direction is greater than the height of the second portion in the first direction.

Figure 4E:
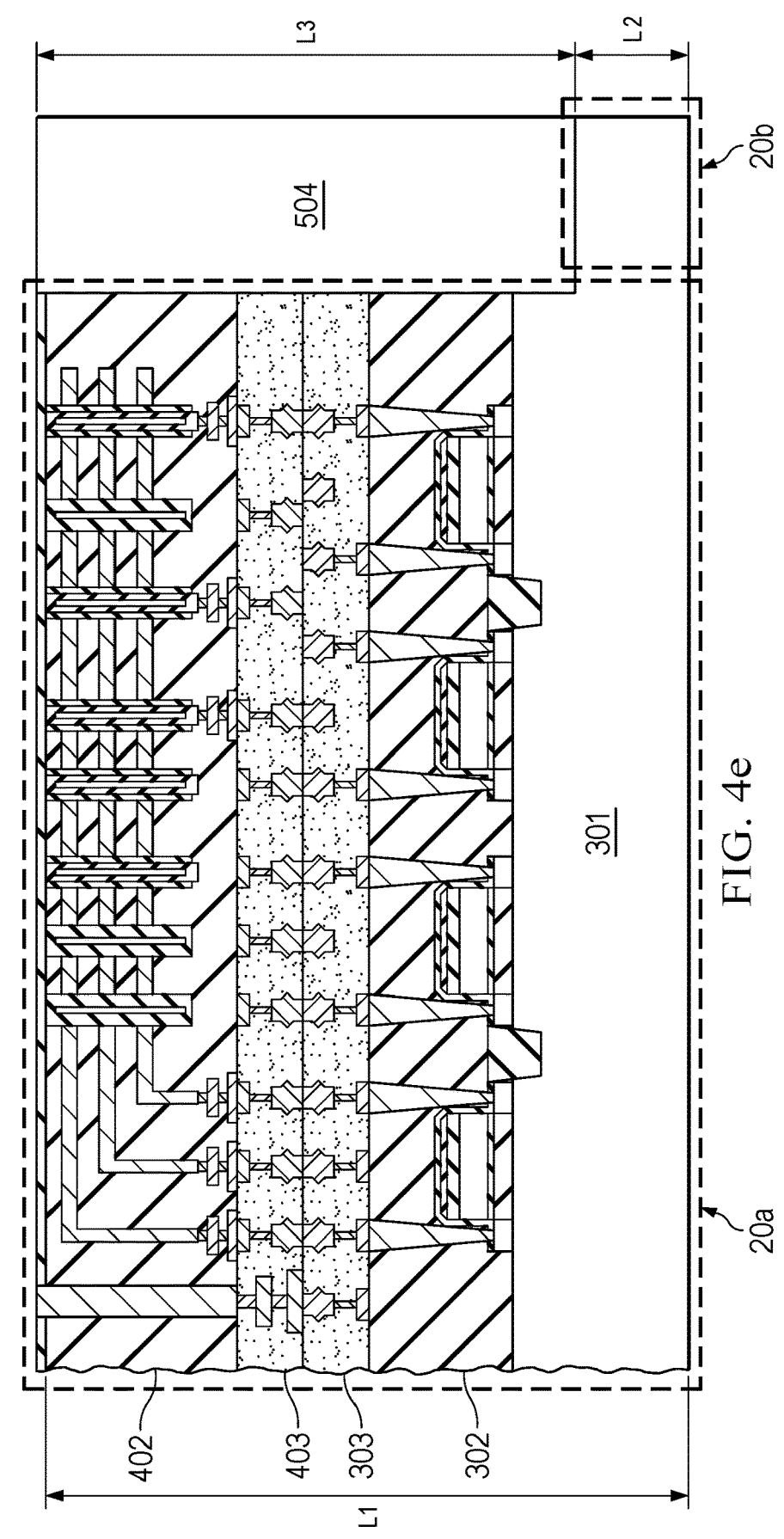
Figure 4F:
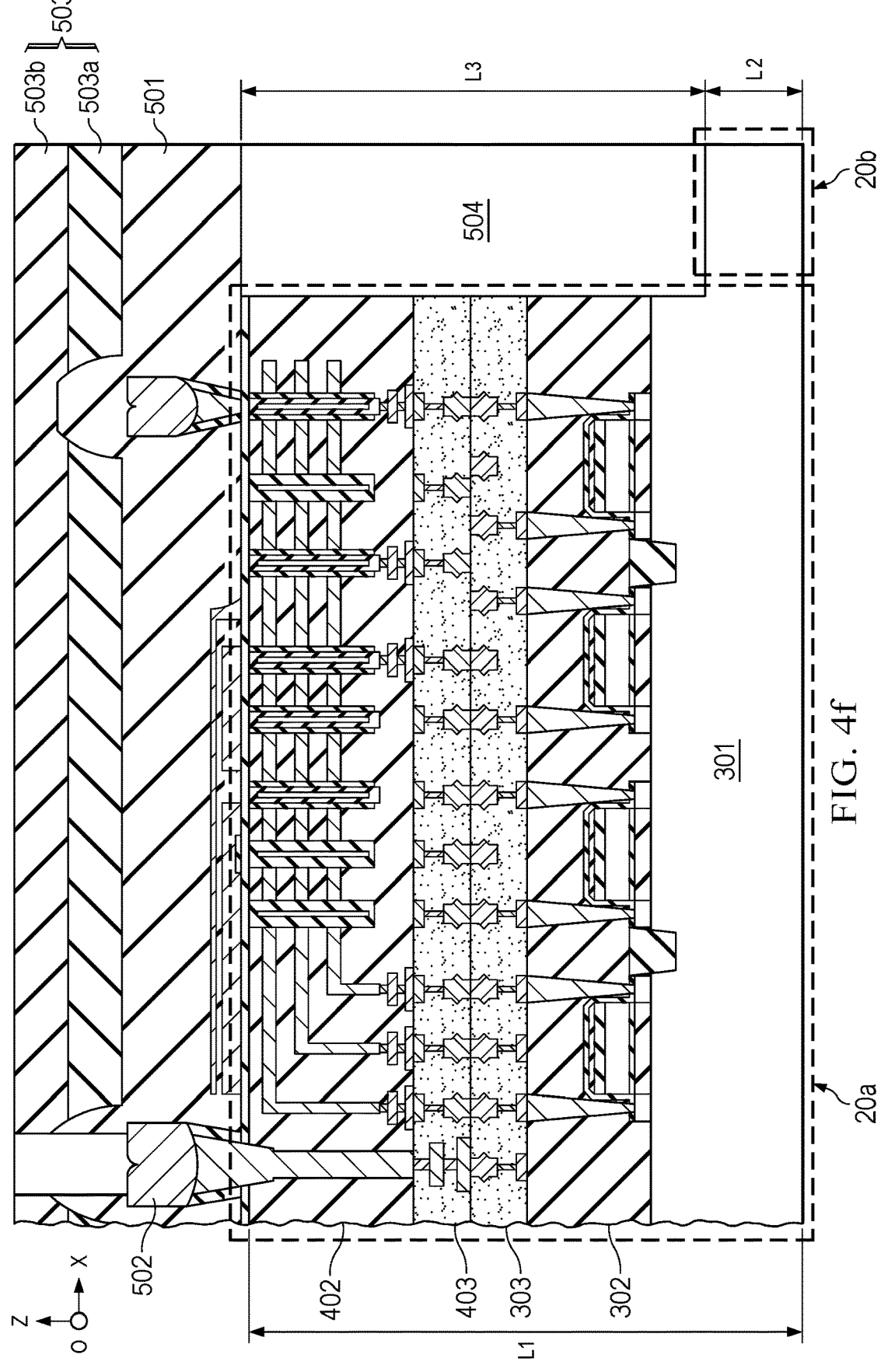

Next, referring to FIG. 4e, in order to reduce the height difference between a second surface of the first portion 20a and a second surface of the second portion 20b, increase relative stress of the second portion 20b and reduce the probability of dropping particle of the second portion 20b, operation S202 is performed, i.e., the filling structure 504 is formed on the second surface of the second portion 20b. The material of the filling structure 504 may be selected according to actual situations; for example, the remaining part of the first semiconductor layer at least comprises one layer structure; and the constituent material of the filling structure and the constituent material of the layer structure are the same or are different. Referring to FIG. 4c, the remaining part of the first semiconductor layer may comprise a plurality of layers, for example, the first substrate 301, part of the first functional layer 302 and the first bonding layer 303, wherein the constituent material of the filling structure 504 may be the same as or different from the material of the first substrate 301, may also be the same as or different from one of the materials in the first functional layer 302, and may also be the same as or different from one of the materials in the first bonding layer 303. For example, the constituent material of the filling structure 504 includes monocrystalline silicon, silicon oxide, silicon nitride, an organic compound, a photoresist material (e.g., photoresist (PR)) or any other suitable materials, etc. The method of forming the filling structure 504 includes, but is not limited to, CVD, PVD and other processes.

Considering that other material layers will form on the second surface of the first portion and the top face of the filling structure in a subsequent process, preferably, the second surface of the first portion and the top face of the filling structure are substantially flush. Based on this, the height of the filling structure in the first direction is less than or equal to the height difference of the first portion and the second portion in the first direction.

For example, referring to FIG. 4c, the height of the first portion 20a in the Z axis direction is a first distance L1, the height of the second portion 20b in the Z axis direction is a second distance L2, and the height of the filling structure 504 in the Z axis direction is a third distance L3. Here, the third distance L3 is less than or equal to the difference between the first distance L1 and the second distance L2, i.e., $L3 \le (L1-L2)$. In some particular implementations, the third distance L3 is greater than $\frac{1}{3}$ of the difference between the first distance L1 and the second distance L2, i.e., $\frac{1}{3}(L1-L2)<L3\le(L1-L2)$; for example, the first distance L1=28 mil, the second distance L2=10 mil, and 6 mil<the third distance L3≤18 mil. The third distance L3 may also be selected and set according to actual requirements, that is to say, according to different implementation requirements, the sizes of the third distance L3 are different.

In some other implementations, the method further comprises: forming a third dielectric layer and a protection layer on a side surface of the second functional layer far away from the second bonding layer and a side surface of the filling structure far away from the second portion; here, the protection layer may comprise a first protection sub-layer and a second protection sub-layer. Exemplarily, referring to FIG. 4f, after forming the filling structure 504, a third dielectric layer 501 is formed on a side surface of the filling structure 504 far away from the second portion 20b and a side surface of the second functional layer 402 far away from the second bonding layer 403; and a first protection sub-layer 503a and a second protection sub-layer 503b covering a first protection sub-layer 503a are formed on third dielectric layer 501. Here, the height L3 of the filling structure 504 in the Z axis direction is equal to the difference between the height L1 of the first portion in the Z axis direction and the height L2 of the second portion in the Z axis direction. As such, the height difference between the second portion 20b and the first portion 20a in the Z axis direction can be reduced by forming the filling structure 504 on the second surface of the second portion 20b, and when the first surface of the second portion 20b is ground and thinned, the relative stress of the second portion 20b is increased, and the dropping of the particle impurities is reduced. Meanwhile, the probability of dropping particle impurities of the sidewall of the first portion 20a can also be reduced, thereby protecting the first portion against damage and improving the reliability of the first portion.

The order of forming the filling structure and forming the protection layer may be exchanged according to actual requirements, wherein after removing the second substrate, the filling structure may be first formed on the second surface of the second portion, or the protection layer may be first formed on the second surface of the second portion. In some other implementations, the method further comprises: Before forming the filling structure, the protection layer is at least formed on the second surface of the second portion, and the second surface of the second portion and the first surface of the second portion are respectively two surfaces of the second portions disposed oppositely in the first direction.

Figure 4G:
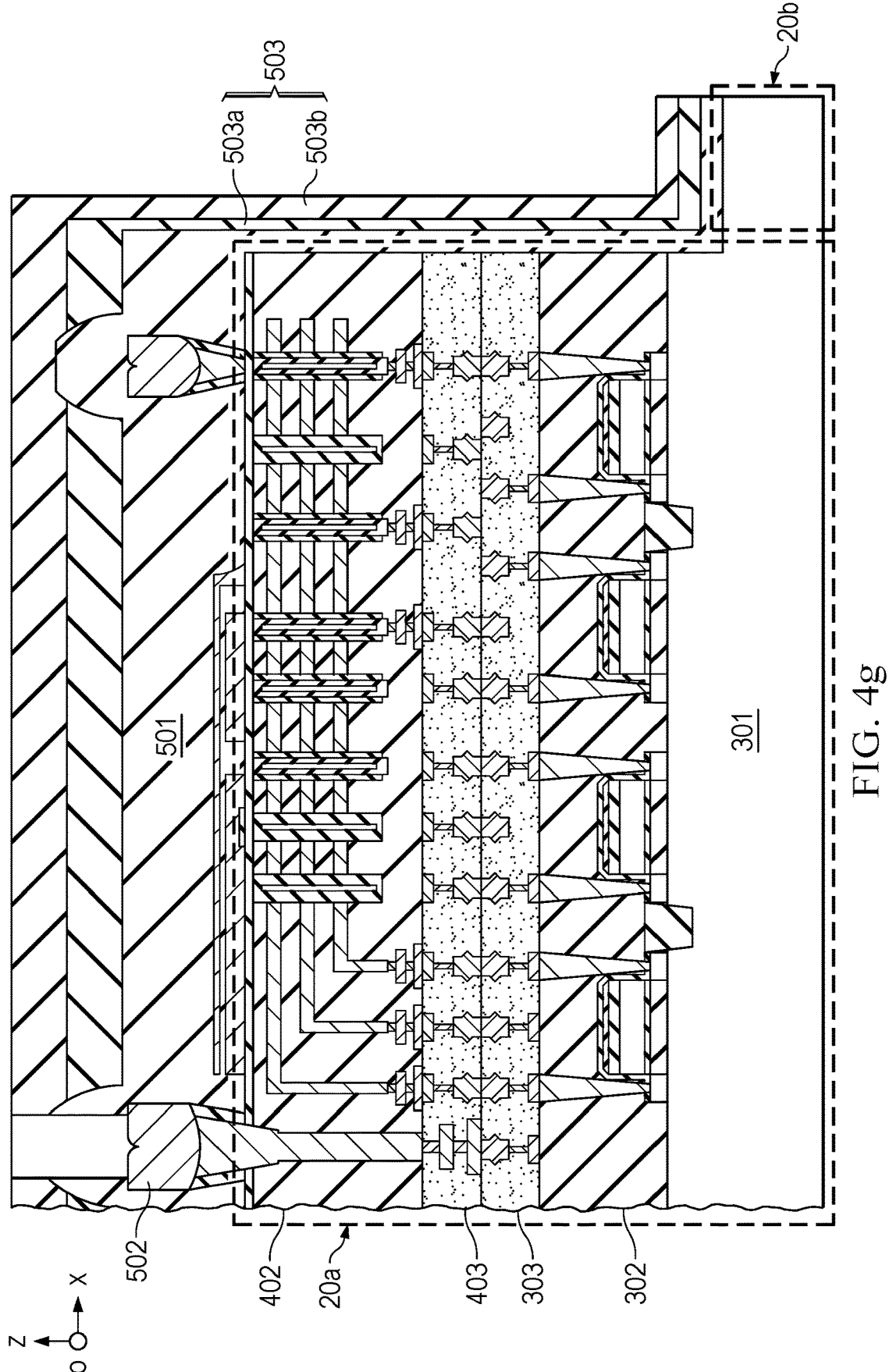
Figure 4H:
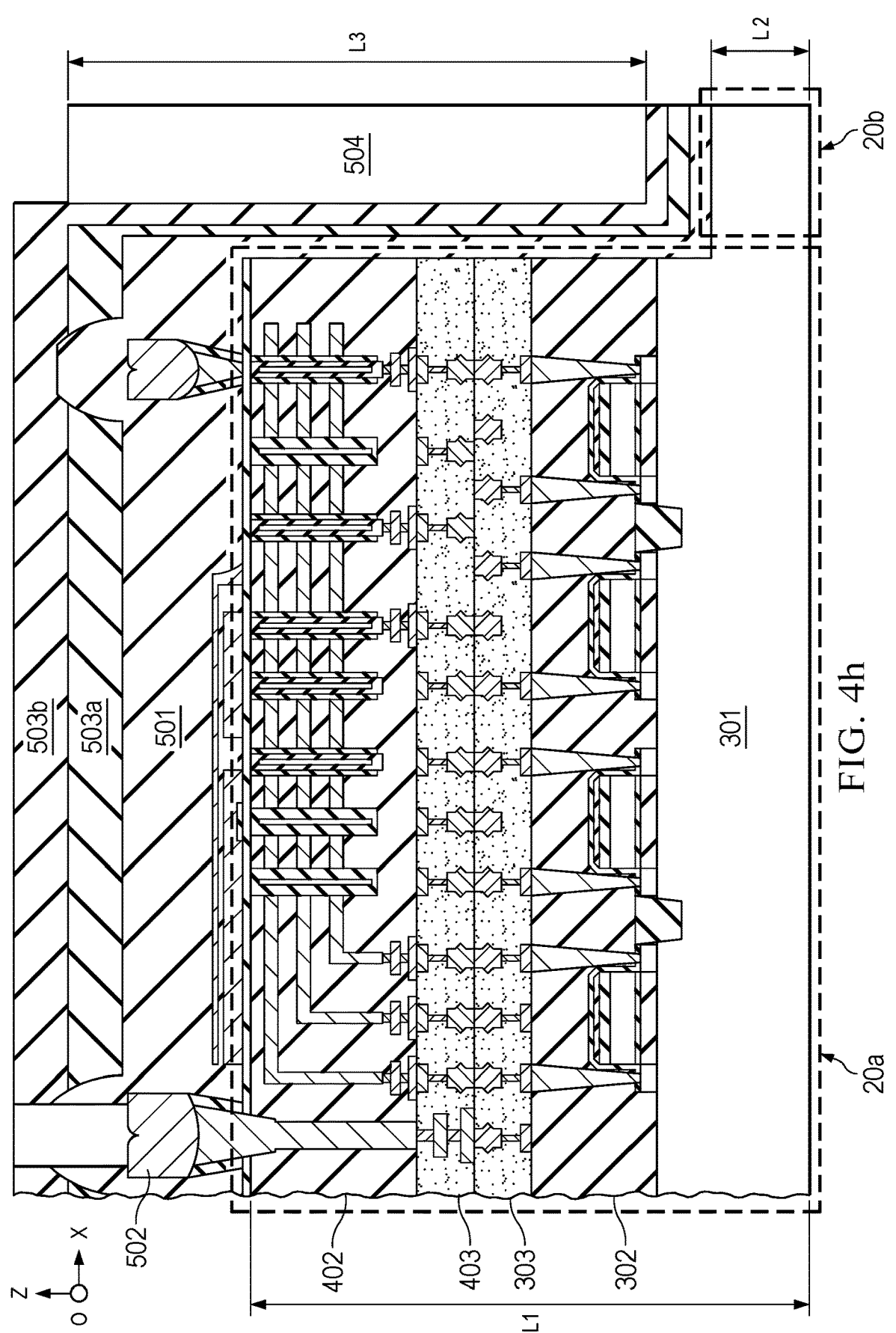

FIG. 4g shows a schematic cross-sectional diagram of part of the semiconductor structure after forming the protection layer. Particularly, after removing the second substrate, the third dielectric layer 501 is formed on a side of the second functional layer 402 far away from the second bonding layer 403, and a plurality of third trenches penetrating through the third dielectric layer 501, and interconnection structures 502 located in the third trenches are formed. The material of the third dielectric layer 501 includes, but is not limited to, silicon oxide. The material of the interconnection structures 502 is a conductive material, e.g., tungsten, cobalt, copper. aluminum or any combination thereof. The method of forming the third dielectric layer 501 and the interconnection structures 502 includes, but is not limited to, CVD, PVD and other processes.

Next, a protection layer 503 covering the third dielectric layer 501 and the second surface of the second portion is formed. Here, the protection layer 503 further covers a sidewall of the first portion 20a. In some particular implementations, the protection layer 503 comprises the first protection sub-layer 503a and the second protection sub-layer 503b covering the first protection sub-layer 503a. Forming the protection layer 503 covering the third dielectric layer 501 and the second surface of the second portion comprises: forming the first protection sub-layer 503a covering the third dielectric layer 501 and the second surface of the second portion; and forming the second protection sub-layer 503b covering the first protection sub-layer 503a. Here, the material of the first protection sub-layer 503a includes, but is not limited to, nitride, e.g., silicon nitride, and the method of forming the first protection sub-layer 503*a* includes, but is not limited to, CVD, PVD and other processes. The material of the second protection sub-layer 503*b* includes, but is not limited to, organic resin, and the method of forming the second protection sub-layer 503*b* includes, but is not limited to, a coating process.

Next, the filling structure covering the protection layer is formed. Here, referring to FIG. 4*h*, the filling structure 504 is located on the protection layer on the second surface of the second portion 20*b*. The relevant content of the filling structure 504 has been mentioned before, and is no longer repeated here. In the following and the drawings, first forming the protection layer and then forming the filling structure is taken as an example for illustration. However, the formation order of the filling structure in the following is only used to illustrate the present disclosure, and is not used to limit the scope of the present disclosure.

In some implementations, the method further comprises: forming an adhesion layer at least on the second surface of the first portion and a side surface of the filling structure far away from the second portion after forming the filling structure, wherein the second surface of the first portion and the first surface of the first portion are two surfaces of the first portion disposed oppositely in the first direction.

Figure 4I:
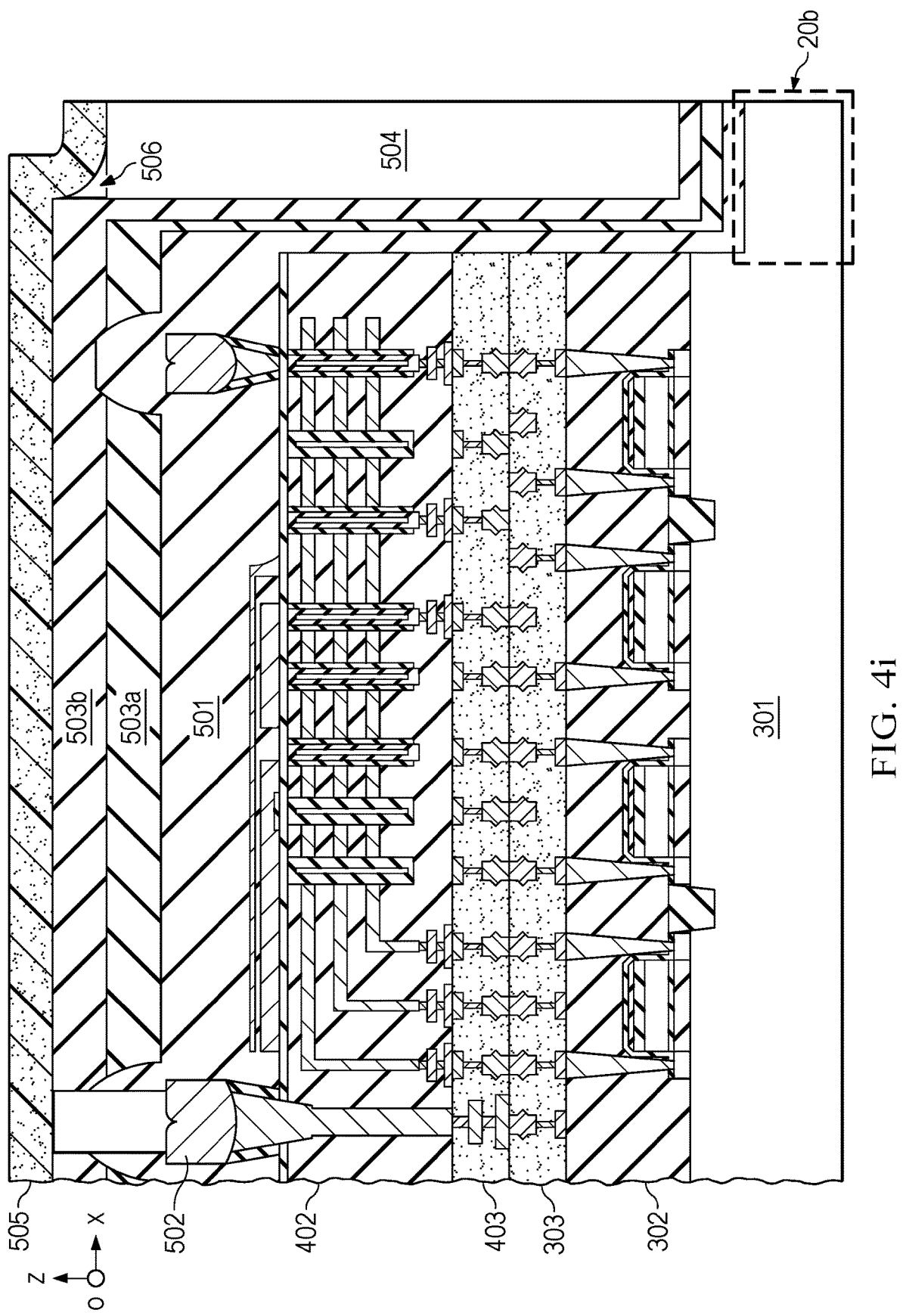

Referring to FIG. 4*i*, the adhesion layer 505 covers the second protection sub-layer and a side surface of the filling structure 504 far away from the second portion 20*b*. When the first substrate 301 in the first semiconductor layer is thinned, the adhesion layer 505 is used to fix and protect the currently formed semiconductor structure. Here, the adhesion layer 505 may be a BG tape.

Since the filling structure 504 has a different height in the Z axis direction, a void 506 may be also present between the adhesion layer 505 and the filling structure 504. However, the height difference between the first portion 20*a* and the second portion 20*b* can be reduced by adding the filling structure 504, and then the size of the void 506 formed between the adhesion layer 505 and the filling structure 504 can be reduced, thereby improving an adhesion capability between the adhesion layer and the filling structure. As such, on one hand, by forming the filling structure 504, the relative stress of the second portion 20*b* can be increased, and the dropping of the particle impurities in the second portion 20*b* is reduced; on the other hand, the dropped particle impurities during grinding of the first substrate can also be adhered through the adhesion layer in a subsequent grinding process, thereby reducing the damage of the particle impurities to the semiconductor structure and improving the reliability of the semiconductor structure.

Figure 4J:
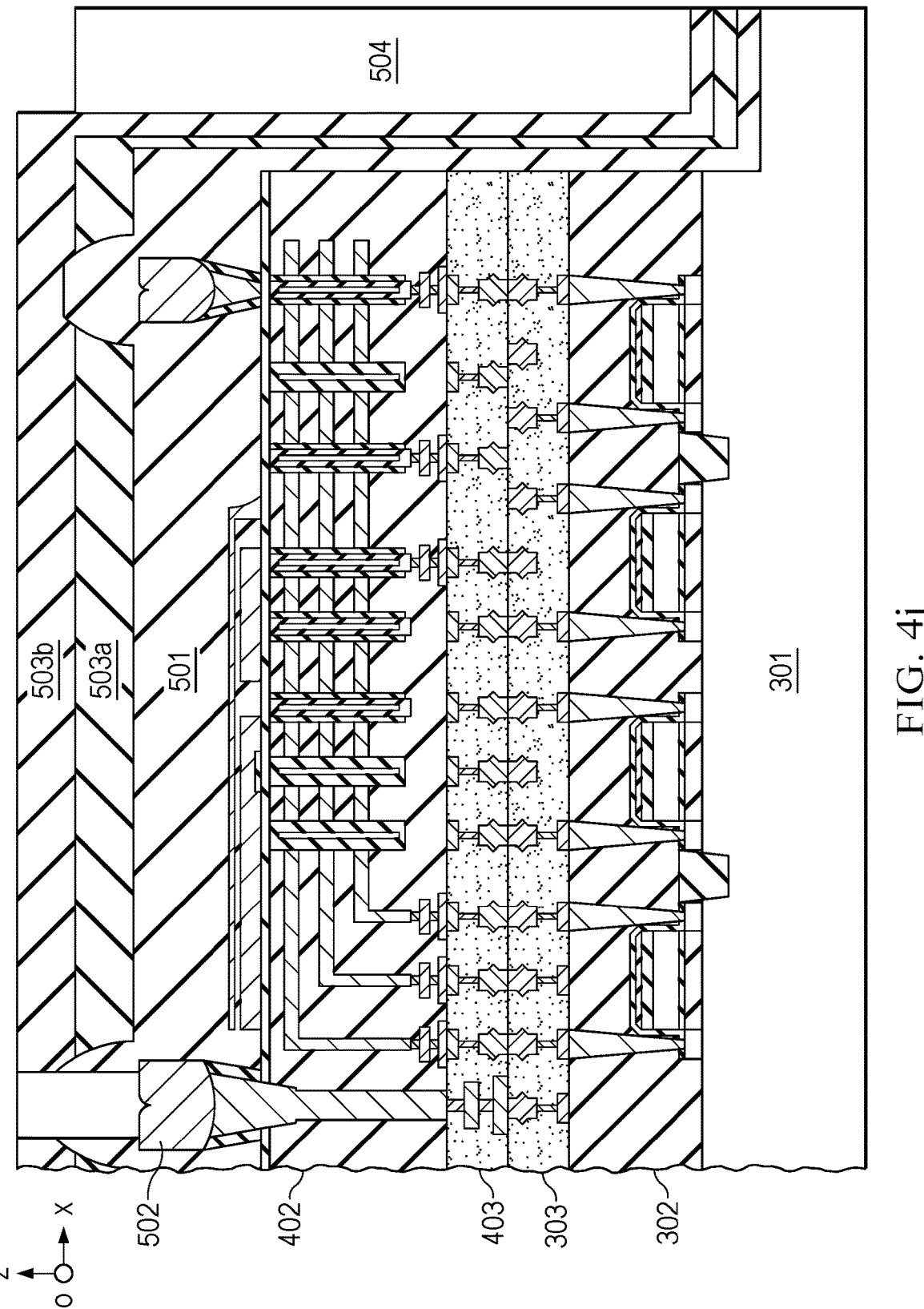

Next, the first substrate is thinned, and the thinning processing described here is to remove part of the first substrate 301. Referring to FIG. 4*j*. part of the first substrate 301 may be removed by a chemical mechanical polishing (CMP) process. In some other implementations, a fourth dielectric layer (not shown) is further formed on a side of the first substrate 301 far away from the first functional layer 302, and the material of the fourth dielectric layer includes, but is not limited to, silicon nitride. Based on this, removing part of the first substrate further comprises: removing the fourth dielectric layer when thinning the first substrate. A process of removing the fourth dielectric layer includes, but is not limited to, CMP.

In some implementations, after thinning the first substrate, the remaining first portion 20*a* constitutes the first region of the stack structure, and after thinning the first substrate, the remaining second portion 20*b* constitutes the second region of the stack structure.

Next, the method further comprises: referring to FIG. 4*j*, removing the adhesion layer after performing the thinning operation on the first substrate.

Based on this, in the implementations of the present disclosure, by forming the filling structure on the second surface of the second portion (the second portion after thinning processing) of the stack structure, the relative stress of the second portion is increased, and the probability of dropping particle impurities of the second portion in the grinding process is reduced, thereby reducing the damage of the particle impurities to the first portion (the first portion after the thinning processing), and improving the reliability of the semiconductor structure.

In another aspect, based on the above formation method of the semiconductor structure, implementations of the present disclosure further provide a semiconductor structure, comprising:

a stack structure comprising a first stack layer and a second stack layer stacked together, wherein a first region and a second region surrounding the first region are disposed in the stack structure, and a first surface of the first region and a first surface of the second region are coplanar; and a filling structure located on a second surface of the second region, wherein the second surface and the first surface of the second region are respectively two surfaces of the second region disposed oppositely in a first direction that is parallel to a stack layer extending direction of the stack structure.

In some implementations, a height of the first region in the first direction is greater than a height of the second region in the first direction, and a height of the filling structure in the first direction is less than or equal to a height difference of the first region and the second region in the first direction.

In some implementations, the height of the first region in the first direction is a first distance L1, the height of the second region in the first direction is a second distance L2, and the height of the filling structure in the first direction is a third distance L3, wherein $\frac{1}{3}(L1-L2)<L3\le(L1-L2)$.

In some implementations, the second region at least comprises one layer structure, and a constituent material of the filling structure and a constituent material of the layer structure are the same or are different.

In some implementations, the constituent material of the filling structure includes silicon, silicon nitride, silicon oxide or a photoresist material.

In some implementations, the semiconductor structure further comprises a protection layer that is at least located between the second surface of the second region and the filling structure.

In some implementations, the first stack layer comprises a peripheral circuit, and the second stack layer comprises a memory cell array.

In another aspect, implementations of the present disclosure further provide a memory device comprising: one or more of the semiconductor structures as described in the above-mentioned embodiments of the present disclosure.

In another aspect, implementations of the present disclosure further provide a memory system comprising: the memory device as described in the above implementations of the present disclosure; and a memory controller connected with the memory device and used to control the memory device.

References to "one embodiment" or "an embodiment" throughout this specification mean that particular features, structures, or characteristics related to the embodiment are included in at least one embodiment of the present disclosure. Therefore, "in one implementation" or "in an implementation" appeared throughout this specification does not necessarily refer to the same implementation. Furthermore, these particular features, structures, or characteristics may be incorporated in one or more implementations in any suitable manner. It should be understood that, in various implementations of the present disclosure, sequence numbers of the above processes do not indicate an execution sequence, and an execution sequence of various processes should be determined by functionalities and intrinsic logics thereof, and should constitute no limitation on an implementation process of the implementations of the present disclosure. The above sequence numbers of the implementations of the present disclosure are only for description, and do not represent advantages or disadvantages of the implementations.

The methods disclosed in several method implementations as provided by the present disclosure may be arbitrarily combined to obtain new method implementations in case of no conflicts.

The above descriptions are merely specific implementations of the present disclosure, and the protection scope of the present disclosure is not limited to these. Any variation or replacement that may be readily conceived by those skilled in the art within the technical scope disclosed by the present disclosure shall fall within the protection scope of the present disclosure. Therefore, the protection scope of the present disclosure shall be defined by the protection scope of the claims.

What is claimed is:

1. A semiconductor structure, comprising:
a stack structure, wherein a first region and a second region surrounding the first region are disposed in the stack structure, and a first surface of the first region and a first surface of the second region are coplanar;
a filling structure located on a second surface of the second region, wherein the second surface and the first surface of the second region are respectively two surfaces of the second region disposed oppositely in a first direction that is parallel to a stack layer extending direction of the stack structure; and
a protection layer that is located between the second surface of the second region and the filling structure.

2. The semiconductor structure of claim 1, wherein a height of the first region in the first direction is greater than a height of the second region in the first direction, and a height of the filling structure in the first direction is less than or equal to a height difference of the first region and the second region in the first direction.

3. The semiconductor structure of claim 2, wherein the height of the first region in the first direction is a first distance L1, the height of the second region in the first direction is a second distance L2, and the height of the filling structure in the first direction is a third distance L3,
wherein $\frac{1}{3}(L1-L2) < L3 \leq (L1-L2)$.

4. The semiconductor structure of claim 1, wherein the second region at least comprises one layer structure; and a constituent material of the filling structure and a constituent material of the layer structure are the same.

5. The semiconductor structure of claim 1, wherein a constituent material of the filling structure includes silicon, silicon nitride, silicon oxide or a photoresist material.

6. The semiconductor structure of claim 1, wherein the stack structure comprises a first stack layer and a second stack layer stacked together, the first stack layer comprises a peripheral circuit, and the second stack layer comprises a memory cell array.

7. A memory device, comprising:
a semiconductor structure, comprising:
a stack structure comprising a first stack layer and a second stack layer stacked together, wherein a first region and a second region surrounding the first region are disposed in the stack structure, and a first surface of the first region and a first surface of the second region are coplanar;
a filling structure located on a second surface of the second region, wherein the second surface and the first surface of the second region are respectively two surfaces of the second region disposed oppositely in a first direction that is parallel to a stack layer extending direction of the stack structure; and
a protection layer that is located between the second surface of the second region and the filling structure.

8. A fabrication method of a semiconductor structure, comprising:
providing a stack structure comprising a first stack layer and a second stack layer stacked together, wherein a first region and a second region surrounding the first region are disposed in the stack structure, and a first surface of the first region and a first surface of the second region are coplanar;
forming a filling structure covering a second surface of the second region, wherein the second surface and the first surface of the second region are respectively two surfaces of the second region disposed oppositely in a first direction that is parallel to a stacking direction of the first stack layer and the second stack layer; and
forming a protection layer at least on the second surface of the second region before forming the filling structure.

9. The fabrication method of claim 8, wherein a height of the first region in the first direction is greater than a height of the second region in the first direction, and a height of the filling structure in the first direction is less than or equal to a height difference of the first region and the second region in the first direction.

10. The fabrication method of claim 9, wherein the height of the first region in the first direction is a first distance L1, the height of the second region in the first direction is a second distance L2, and the height of the filling structure in the first direction is a third distance L3,
wherein $\frac{1}{3}(L1-L2) < L3 \leq (L1-L2)$.

11. The fabrication method of claim 8, wherein providing the stack structure comprises:
providing a first semiconductor layer and a second semiconductor layer stacked together, wherein the first semiconductor layer and the second semiconductor layer each comprises a core area and a marginal area surrounding the core area, projections of the core area of the first semiconductor layer and the core area of the second semiconductor layer along the first direction overlap, and projections of the marginal area of the first semiconductor layer and the marginal area of the second semiconductor layer along the first direction overlap;
removing the marginal area of the second semiconductor layer, with the remaining second semiconductor layer constituting the second stack layer; and removing part of the marginal area of the first semiconductor layer, with the remaining first semiconductor layer constituting the first stack layer, the first stack layer and the second stack layer being stacked together to constitute the stack structure, wherein the second stack layer and the core area of the first semiconductor layer constitute the first region, and part of the marginal area of the remaining first semiconductor layer constitutes the second region.

12. The fabrication method of claim 11, wherein providing the first semiconductor layer and the second semiconductor layer stacked together comprises:

providing a first substrate, forming a first functional layer covering the first substrate, and forming a first bonding layer covering the first functional layer to form the first semiconductor layer;

providing a second substrate, forming a second functional layer covering the second substrate, and forming a second bonding layer covering the second functional layer to form the second semiconductor layer; and bonding the first bonding layer to the second bonding layer to form the first semiconductor layer and the second semiconductor layer stacked together.

13. The fabrication method of claim 12, wherein removing the marginal area of the second semiconductor layer with the remaining second semiconductor layer constituting the second stack layer, comprises:

removing the marginal area of the second semiconductor layer, and removing the remaining second substrate, with the remaining second functional layer and the remaining second bonding layer constituting the second stack layer.

14. The fabrication method of claim 13, further comprising:

forming an adhesion layer at least on a second surface of the first region and a side surface of the filling structure after forming the filling structure, wherein the second surface of the first region and the first surface of the first region are two surfaces of the first region disposed oppositely in the first direction;

wherein removing part of the marginal area of the first semiconductor layer, with the remaining first semiconductor layer constituting the first stack layer, comprises removing part of the marginal area of the first semiconductor layer, and thinning the first substrate, with the remaining first semiconductor layer constituting the first stack layer;

and wherein the fabrication method further comprises removing the adhesion layer after the thinning operation.

15. The fabrication method of claim 11, wherein the remaining part of the first semiconductor layer at least comprises one layer structure, and wherein a material of the filling structure and a material of the layer structure are different.

16. The fabrication method of claim 8, wherein forming the filling structure covering the second surface of the second region comprises forming the protection layer covering the second surface of the second region and forming the filling structure covering the protection layer.

* * * * *